United States Patent
Pan et al.

(10) Patent No.: US 10,936,784 B2
(45) Date of Patent: Mar. 2, 2021

(54) PLANNING METHOD FOR POWER METAL LINES

(71) Applicant: REALTEK SEMICONDUCTOR CORP., Hsinchu (TW)

(72) Inventors: Hsin-Wei Pan, Hsinchu (TW); Li-Yi Lin, Hsinchu (TW); Yun-Chih Chang, Hsinchu (TW); Shu-Yi Kao, Hsinchu (TW)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/704,109

(22) Filed: Dec. 5, 2019

(65) Prior Publication Data

US 2021/0004520 A1 Jan. 7, 2021

(30) Foreign Application Priority Data

Jul. 2, 2019 (TW) .................................. 108123330

(51) Int. Cl.
*G06F 30/3953* (2020.01)
*G06F 30/392* (2020.01)

(52) U.S. Cl.
CPC ........ *G06F 30/3953* (2020.01); *G06F 30/392* (2020.01)

(58) Field of Classification Search
CPC ............................ G06F 30/3953; G06F 30/392
USPC ...................................................... 716/124
See application file for complete search history.

(56) References Cited

U.S. PATENT DOCUMENTS

| | | | | |
|---|---|---|---|---|
| 6,405,346 | B1* | 6/2002 | Nawa | G06F 30/394 716/115 |
| 10,546,089 | B1* | 1/2020 | Cocchini | G06F 30/39 |
| 2008/0028352 | A1* | 1/2008 | Birch | G06F 30/394 716/112 |
| 2011/0246959 | A1* | 10/2011 | Tang | G06F 30/3312 716/127 |
| 2012/0221990 | A1* | 8/2012 | Dai | G06F 30/367 716/112 |
| 2015/0178441 | A1* | 6/2015 | Chiu | G06F 30/394 716/111 |
| 2016/0132616 | A1* | 5/2016 | Hassel | G06Q 50/06 703/1 |
| 2019/0122984 | A1* | 4/2019 | Kim | H01L 23/5226 |
| 2020/0050728 | A1* | 2/2020 | Kim | G06F 30/394 |

* cited by examiner

*Primary Examiner* — Suresh Memula
(74) *Attorney, Agent, or Firm* — Birch, Stewart, Kolasch & Birch, LLP

(57) ABSTRACT

A planning method for power metal lines is provided. The planning method includes selecting a block to plan, the block including a first metal layer and a second metal layer therebelow. The first metal layer includes a plurality of first metal lines along a first direction and the second metal layer includes a plurality of second metal lines along a second direction. The block includes a length in the first direction and a width in the second direction. According to a ratio of the length and the width of the block, a line width adjustment procedure is performed to adjust a first line width of each of the first metal lines and a second line width of each of the second metal lines, so that routing congestion can be avoided without affecting the IR drop.

10 Claims, 4 Drawing Sheets

S186 — Select a sub-block to plan in a block

S188 — Perform a line width adjustment procedure according to a ratio of a length and a width of the sub-block, to adjust a first line width of each of first metal lines and a second line width of each of second metal lines

PLANNING METHOD FOR POWER METAL LINES

CROSS-REFERENCE TO RELATED APPLICATION

This non-provisional application claims priority under 35 U.S.C. § 119(a) to Patent Application No. 108123330 in Taiwan, R.O.C. on Jul. 2, 2019, the entire contents of which are hereby incorporated by reference.

BACKGROUND

Technical Field

The present invention relates to a power planning method for a digital design, and in particular, to a planning method for power metal lines that takes a block shape into consideration.

Related Art

Automatic placement routing (APR) is a late stage of a digital design process and is mainly used for placing and routing cells generated at an early stage to form a layout for manufacturers to subsequently fabricate chips.

In a block level backend implementation phase, a chip-top APR designer provides a basic block shape of each block and specification information for creating a power-plan, including metal layers, a metal width, a metal spacing, and the like to be used. Generally, the chip-top APR designer may use the two upper layers of metal (T0 and T-1) to create the power-plan. In addition, the second layer of metal (T-2) and the third layer of metal (T-3) below the topmost metal layer (T0) may be used to plan an additional power mesh in vertical and horizontal directions.

Placement and routing are performed only after the above power-plan is completed. However, for a common elongated or flat block, due to the lack of routing resources in a certain direction, signal wiring congestion is likely to occur. In the case of congestion, most APR tools adopt the following two solutions: pushing away components in a congested area away in the placement phase; or taking a detour in the routing phase so that a signal cable avoid the congested area. However, both the two solutions affect performance and power consumption. When the congested area cannot be resolved by using the above methods, the area of the block needs to be enlarged, increasing the costs and affecting the entire procedure. At a late stage of the block level backend implementation phase, the power mesh may be reduced or part of the power mesh may be removed to increase routing resources. However, in this case, the entire power-plan architecture cannot be compensated, so there is still a risk that the IR drop increases.

SUMMARY

To resolve the foregoing problems, in the present invention, effective planning and distribution are implemented for a power-plan at the beginning of a placement design without affecting the IR drop, so as to avoid the case in the prior art that an APR tool pushes components away to resolve the congestion problem, and achieve optimal performance, power consumption, and area.

In view of this, the present invention provides a planning method for power metal lines, including: selecting a block to plan, where the block includes a first metal layer and a second metal layer therebelow, the first metal layer includes M first metal lines along a first direction, each of the first metal lines includes a first line width, the second metal layer includes N second metal lines along a second direction, each of the second metal lines includes a second line width, and the block includes a length in the first direction and a width in the second direction; and performing a line width adjustment procedure according to a ratio of the length and the width of the block to adjust the first line width of each of the first metal lines and the second line width of each of the second metal lines. The line width adjustment procedure includes: when the length of the block is greater than the width, reducing the first line width of each of the first metal lines and increasing the second line width of each of the second metal lines; and when the length of the block is less than the width, reducing the second line width of each of the second metal lines and increasing the first line width of each of the first metal lines.

The present invention also provides another planning method for power metal lines, including: selecting a sub-block to plan from one of the blocks, where the sub-block includes a first metal layer and a second metal layer therebelow, the first metal layer includes M first metal lines along a first direction, each of the first metal lines includes a first line width, the second metal layer includes N second metal lines along a second direction, each of the second metal lines includes a second line width, and the sub-block includes a length in the first direction and a width in the second direction; and performing a line width adjustment procedure according to the ratio of the length and the width of the sub-block to adjust the first line width of each of the first metal lines and the second line width of each of the second metal lines. The line width adjustment procedure includes: when the length of the sub-block is greater than the width, reducing the first line width of each of the first metal lines and increasing the second line width of each of the second metal lines; and when the length of the sub-block is less than the width, reducing the second line width of each of the second metal lines and increasing the first line width of each of the first metal lines.

According to an embodiment, the first direction is perpendicular to the second direction.

According to an embodiment, in the line width adjustment procedure, when the length is greater than the width, the first metal line satisfies $D1'*M<D1*M$, where D1 is the original first line width and D1' is the reduced first line width, and the second metal line satisfies $D2'*N>D2*N$, where D2 is the original second line width and D2' is the increased second line width.

According to an embodiment, in the line width adjustment procedure, when the length is less than the width, the first metal line satisfies $D1'*M>D1*M$, where D1 is the original first line width and D1' is the increased first line width, and the second metal line satisfies $D2'*N<D2*N$, where D2 is the original second line width and D2' is the reduced second line width.

According to an embodiment, the first direction is a horizontal direction, and the second direction is a vertical direction; or, the first direction is a vertical direction, and the second direction is a horizontal direction.

Based on the above, in the present invention, the horizontal and vertical widths of the power metal lines are automatically adjusted by taking the block shape into consideration, so that routing congestion can be reduced without affecting the IR drop.

DETAILED DESCRIPTION

In a block level backend implementation phase, a chip-top APR designer provides a basic block shape for each block and specification information for creating a power-plan. A ratio of a length to a width of the block shape affects routing resources, for example, the more elongated the block is, the fewer vertical routing resources there are; the flatter the block is, the fewer horizontal routing resources there are. Therefore, the block shape determines whether a routing (signal wiring) congested area is in a vertical direction or in a horizontal direction. In addition, the metal density used in the power-plan is closely related to the IR drop. The higher the overall metal density is, the more moderate the IR drop is. On the contrary, an unduly low metal density is likely to cause a more severe IR drop. Therefore, the planning method for power metal lines provided in the present invention can take the block shape into consideration, and automatically adjust the horizontal and vertical widths of the power metal lines, so as to increase routing resources and maintain a sufficient metal density.

Figure 1:
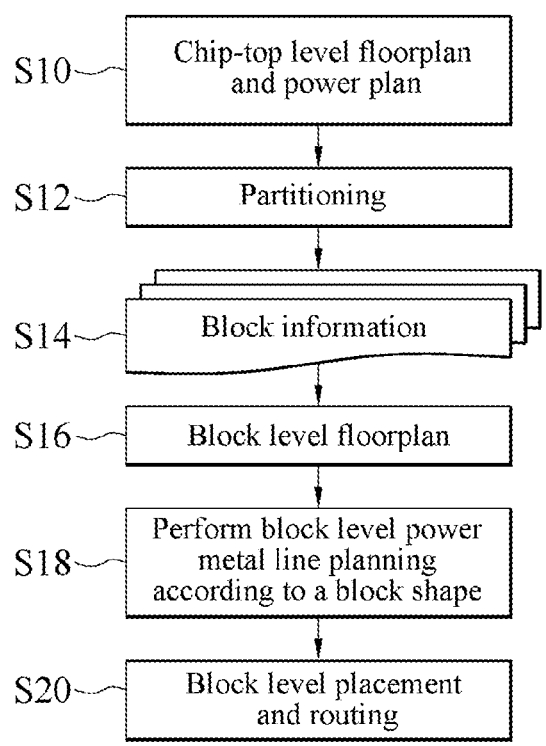
FIG. 1 is a flowchart of a chip design according to an embodiment of the present invention.

FIG. 1 is a flowchart of a chip design according to an embodiment of the present invention. Referring to FIG. 1, the entire chip design process is divided into two parts: a chip-top level implementation phase (including steps S10 to S14) that a chip-top APR designer is responsible for; and a block level implementation phase (including steps S16 to S20) that a block APR designer is responsible for.

As shown in step S10, first a chip-top level floorplan and a power-plan are created for overall planning. Then, as shown in steps S12 and S14, partitioning is performed to obtain a plurality of pieces of block information, including metal layers, a metal width, a metal spacing, and the like to be used. In an embodiment, for a large system-on-a-chip (SOC) physical design, in order to make full use of the entire area of the chip, the chip-top APR designer determines block information such as a position, area, and shape of each block as well as the metal layers, the metal width, the metal spacing, and the like to be used, and then transmits the block information to the block APR designer responsible for subsequent steps.

Figure 2:
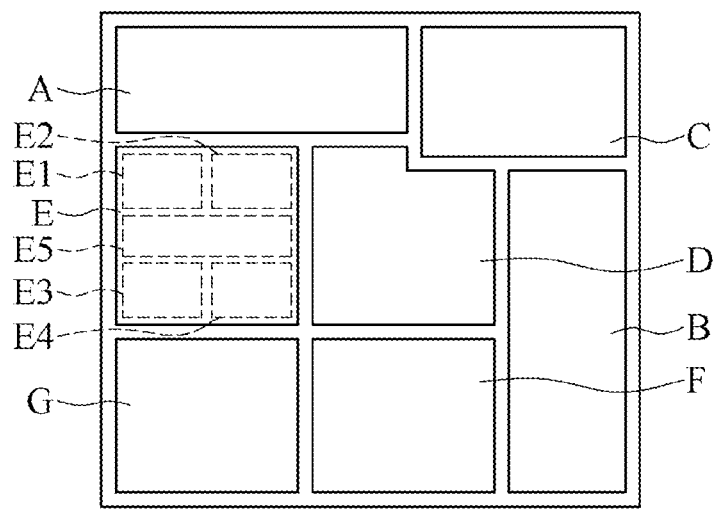
FIG. 2 is a schematic diagram of blocks according to an embodiment of the present invention.

In the chip-top level implementation phase in steps S10 to S14, length-width ratios of blocks are adjusted to be as close as possible. However, limited by the position of an input/output pads (IO pads) or the overall chip plan, a desirable pattern cannot be obtained. As shown in FIG. 2, the flat shape of a block A and the elongated shape of a block B affect routing resources, and the other blocks C, D, E, F, and G are in desirable shapes that are close to each other.

In the chip-top level implementation phase in steps S10 to S14, an overall power-plan is created at the same time (S10).

Figure 3:
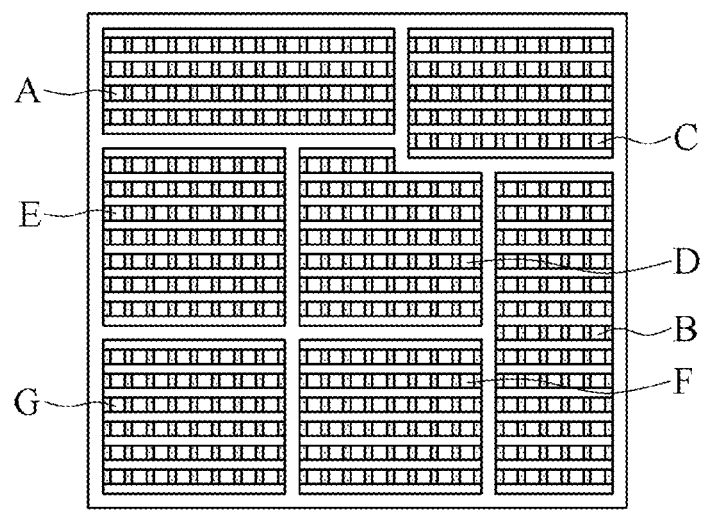
FIG. 3 is a schematic diagram of metal lines of blocks according to an embodiment of the present invention.

Using eight metal layers as an example, the topmost layer of metal (T0) and the first layer of metal (T-1) therebelow are used as a power source and a ground to create the power-plan. Part of the second layer of metal (T-2) and the third layer of metal (T-3) below the topmost layer of metal (T0) are also used as a power source and a ground, and the other metal layers are planned for use as signal lines. As shown in FIG. 3, to be specific, first metal lines on the second layer of metal (T-2) (hereafter referred to as a first metal layer) and second metal lines on the third layer of metal (T-3) (hereafter referred to as a second metal layer).

Referring to FIG. 1 to FIG. 3, after the chip-top level implementation phase is completed, the block level implementation phase in steps S16 to S20 is performed. As shown in step S16, a block level floorplan is created. Then, as shown in step S18, block level power metal line planning is performed according to the block shape to plan power metal lines for particular blocks that are already defined on the chip. The block level placement and routing may be performed as shown in step S20 after the floorplan and planning are completed.

Figure 4:
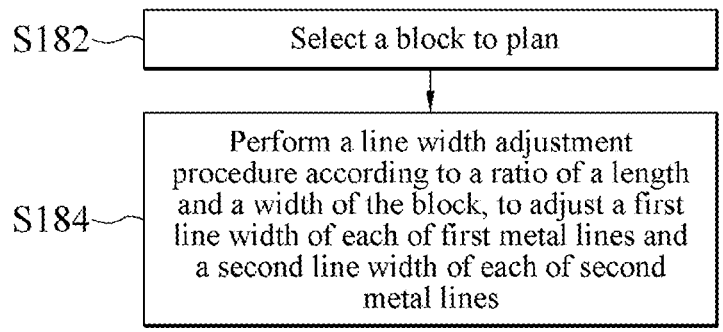
FIG. 4 is a flowchart of planning power metal lines for a block according to an embodiment of the present invention.
Figure 5:
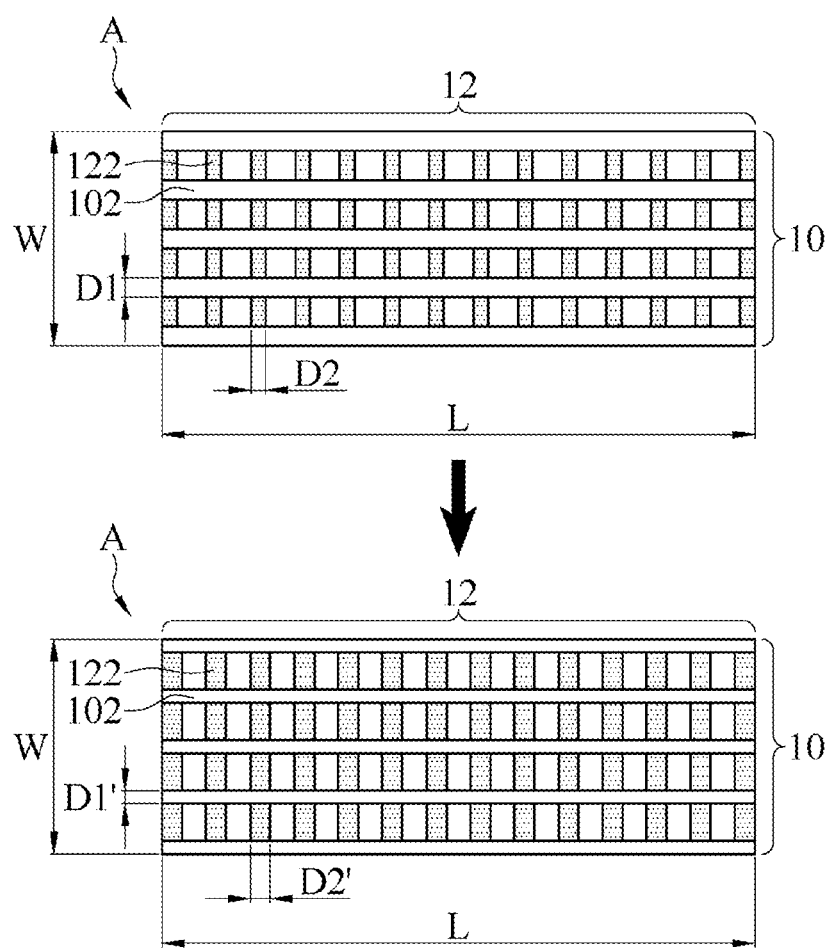
FIG. 5 is a schematic diagram of adjusting metal lines in a flat-shaped block according to an embodiment of the present invention.

When block-level power metal line planning is performed as shown in step S18, the planning method for power metal lines is further as shown in FIG. 4. First, as shown in step S182, a block is selected to plan. For example, the block A in FIG. 2 is selected. Referring to FIG. 4 and FIG. 5, the block A includes a first metal layer 10 and a second metal layer 12 below it. The first metal layer 10 includes M first metal lines 102 along a first direction (which is, for example, a horizontal direction, and is equivalent to an X-axis), and each of the first metal lines 102 includes a first line width D1. The second metal layer 12 includes N second metal lines 122 along a second direction (which is, for example, a vertical direction, and is equivalent to a Y-axis), and each of the second metal lines 122 includes a second line width D2, and the first direction is perpendicular to the second direction. The block A includes a length L in the first direction and a width W in the second direction. As shown in step S184, a line width adjustment procedure is performed according to a ratio of the length L and the width W of the block A to adjust the first line width D1 of each of the first metal lines 102 and the second line width D2 of each of the second metal lines 122.

In the line width adjustment procedure, how to perform adjustment is determined according to the ratio of the length L and the width W of the block A. Because the length L of the flat-shaped block A is greater than the width W (L>W), the first line width D1 of each of the first metal lines 102 is reduced and the second line width D2 of each of the second metal lines 122 is increased, so that the reduction in the width of the first metal layer 10 is compensated for in the second metal layer 12, to maintain the same power density of the power mesh (the first metal lines 102 and the second metal lines 122). In an embodiment, when the length L of the block A is greater than the width W, the first metal line satisfies $D1'*M<D1*M$, where D1 is the original first line width and D1' is the reduced first line width, and the second metal line satisfies $D2'*N>D2*N$, where D2 is the original second line width and D2' is the increased second line width. Because the first line width D1' of the first metal line 102 of the first metal layer 10 becomes smaller, the space between neighboring first metal lines 102 becomes larger, providing more routing resources for arrangement of signal lines.

Figure 6:
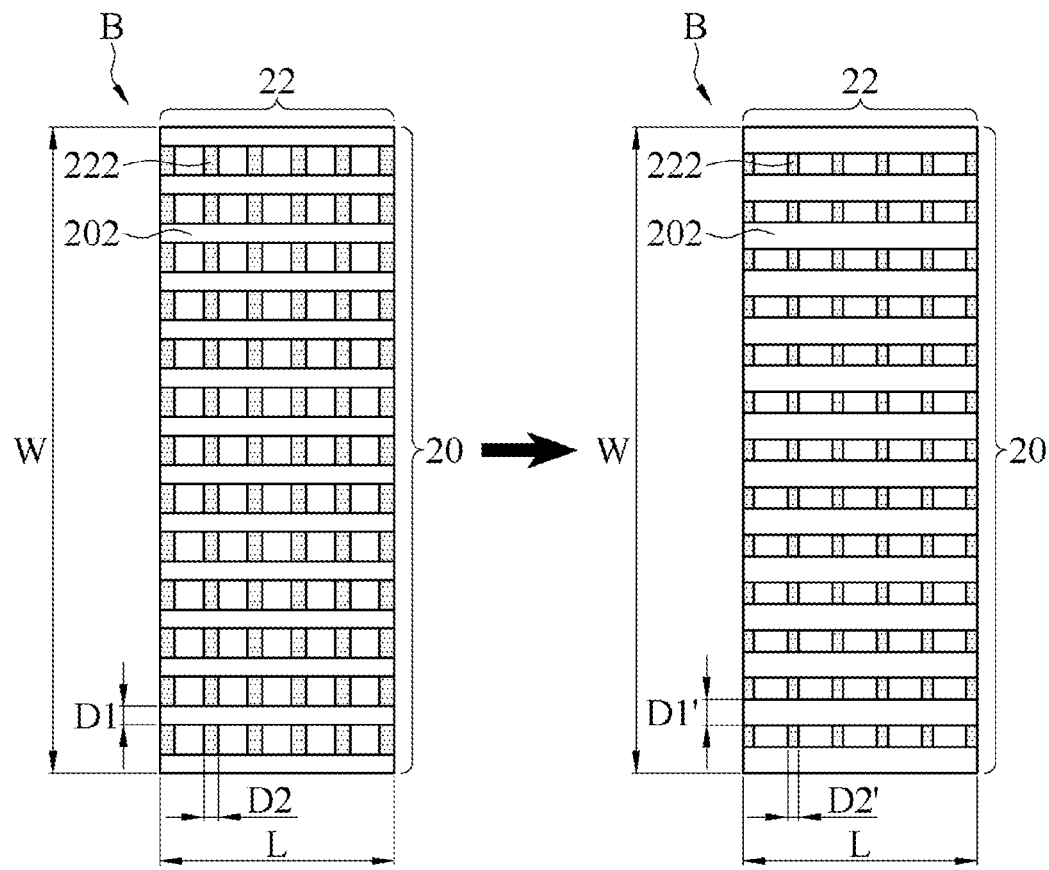
FIG. 6 is a schematic diagram of adjusting metal lines in an elongated block according to an embodiment of the present invention.

For example, the block B in FIG. 2 is selected in step S182. Referring to FIG. 4 and FIG. 6, the block B includes a first metal layer 20 and a second metal layer 22 therebelow. The first metal layer 20 includes M first metal lines 202 along the horizontal direction (the first direction), and each of the first metal lines 202 includes a first line width D1. The second metal layer 22 includes N second metal lines 222 along the vertical direction (the second direction), and each of the second metal lines 222 includes a second line width D2. The block B includes a length L in the horizontal direction and a width W in the vertical direction. In the line width adjustment procedure, because the length L of the elongated block B is less than the width W (L<W), the second line width D2 of each of the second metal lines 222 is reduced and the first line width D1 of each of the first metal lines 202 is increased, so that the reduction in the width of the second metal layer 22 is compensated for in the first metal layer 20, to maintain the same power density of the power mesh. In an embodiment, when the length L of the block B is less than the width W, the first metal line 202 satisfies D1'*M>D1*M, where D1 is the original first line width and D1' is the increased first line width, and the second metal line 222 satisfies D2'*N<D2*N, where D2 is the original second line width and D2' is the reduced second line width. Because the second line width D2' of the second metal line 222 of the second metal layer 22 becomes smaller, the space between neighboring second metal lines 222 becomes larger, providing more routing resources for arrangement of signal lines.

In an embodiment, regardless of a flat-shaped block or an elongated block, a minimum width by which the line width is reduced is determined by a minimum process width.

In an embodiment, not all the blocks require the power metal line planning in step S18. When the ratio of the length to the width of the block is greater than 1 (a flat-shaped block) or the ratio of the width to the length of the block is greater than 1 (an elongated block), the power metal line planning may further be performed on such blocks, to avoid routing congestion.

In the foregoing embodiments, the present invention is described by using a horizontal direction as the first direction and a vertical direction as the second direction. In another embodiment, the first direction may be the vertical direction, and the second direction may be the horizontal direction.

Figure 7:
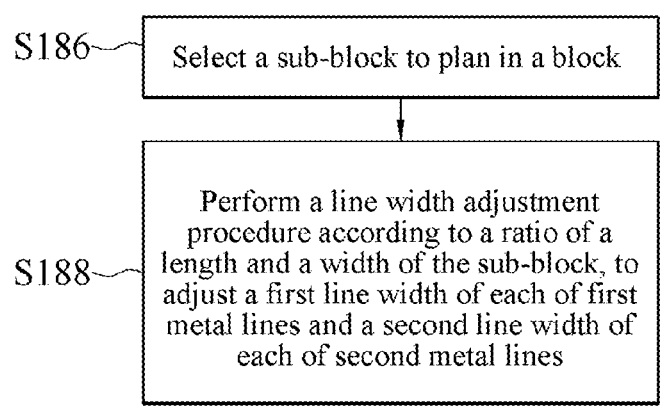
FIG. 7 is a flowchart of planning power metal lines for a sub-block according to another embodiment of the present invention.

Referring to FIG. 2, the planning method for power metal lines in the present invention not only can be applied to the block A and the block B shown in FIG. 2, but also can be applied to a sub-block E5 in a block E. The block E includes sub-blocks E1 to E4 as a core circuit and the sub-block E5 as a logic circuit. Due to the existence of the sub-blocks E1 to E4, the sub-block E5 becomes a flat-shaped block. Therefore, power metal line planning may be performed on the sub-block E5 to increase the space for routing in the sub-block E5. Referring to FIG. 2 and FIG. 7, as shown in step S186, the sub-block E5 is selected to plan from the block E. Then, as shown in step S188, a line width adjustment procedure is performed according to a ratio of a length and a width of the sub-block E5 to adjust a first line width of each of first metal lines and a second line width of each of second metal lines in the sub-block E5. Details of and methods used in the line width adjustment procedure in FIG. 7 are the same as those of the embodiment of the flat-shaped block in FIG. 5 except that the adjustment target of the line width adjustment procedure of FIG. 7 is the sub-block E5, so the details will not be described herein again. Therefore, more routing resources can be provided within the sub-block E5.

In an embodiment, not all the sub-blocks require the power metal line planning. When the ratio of the length to the width of the sub-block is greater than 1 (a flat-shaped block) or the ratio of the width to the length of the sub-block is greater than 1 (an elongated block), the power metal line planning may further be performed on such sub-blocks, to avoid routing congestion.

In an embodiment, the chip-top APR designer and the block APR designer may perform the foregoing method using, for example, but not limited to, an electronic device such as a computer or a notebook computer. The electronic device includes a particular application program or software installed therein for the designer to perform chip design and planning.

Therefore, in the present invention, the horizontal and vertical widths of the power metal lines are automatically adjusted by taking the block shape into consideration in a power-plan, so that sufficient routing resources are provided without affecting the IR drop, thereby reducing routing congestion, and achieving optimal performance, power consumption, and area, especially for flat-shaped and elongated blocks that lack routing resources in one direction and include sufficient routing resources in the other direction. Therefore, after power metal line planning is performed by using the method of the present invention, sufficient routing resources can be provided, so that the routing congestion can be avoided.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A planning method for power metal lines, adapted for a plurality of blocks on a chip, the planning method for power metal lines comprising:
   selecting a block to plan by an electronic device, wherein the block comprises a first metal layer and a second metal layer therebelow, the first metal layer comprises M first metal lines along a first direction, each of the first metal lines comprises a first line width, the second metal layer comprises N second metal lines along a second direction, each of the second metal lines comprises a second line width, and the block comprises a length in the first direction and a width in the second direction; and
   performing, by the electronic device, a line width adjustment procedure according to a ratio of the length and the width of the block to adjust the first line width of each of the first metal lines and the second line width of each of the second metal lines, wherein the line width adjustment procedure comprises:
      when the length is greater than the width, reducing the first line width of each of the first metal lines and increasing the second line width of each of the second metal lines; and
      when the length is less than the width, reducing the second line width of each of the second metal lines and increasing the first line width of each of the first metal lines.

2. The planning method for power metal lines according to claim 1, wherein the first direction is perpendicular to the second direction.

3. The planning method for power metal lines according to claim 1, wherein in the line width adjustment procedure, when the length is greater than the width, the first metal line satisfies $D1'*M<D1*M$, wherein D1 is the original first line width and D1' is the reduced first line width, and the second metal line satisfies $D2'*N>D2*N$, wherein D2 is the original second line width and D2' is the increased second line width.

4. The planning method for power metal lines according to claim 1, wherein in the line width adjustment procedure, when the length is less than the width, the first metal line satisfies $D1'*M>D1*M$, wherein D1 is the original first line width and D1' is the increased first line width, and the second metal line satisfies $D2'*N<D2*N$, wherein D2 is the original second line width and D2' is the reduced second line width.

5. The planning method for power metal lines according to claim 1, wherein the first direction is a horizontal direction, and the second direction is a vertical direction; or the first direction is a vertical direction, and the second direction is a horizontal direction.

6. A planning method for power metal lines, adapted for a plurality of blocks on a chip, the planning method for power metal lines comprising:
   selecting a sub-block to plan from one of the blocks by an electronic device, wherein the sub-block comprises a first metal layer and a second metal layer therebelow, the first metal layer comprises M first metal lines along a first direction, each of the first metal lines comprises a first line width, the second metal layer comprises N second metal lines along a second direction, each of the second metal lines comprises a second line width, and the sub-block comprises a length in the first direction and a width in the second direction; and
   performing, by the electronic device, a line width adjustment procedure according to a ratio of the length and the width of the sub-block to adjust the first line width of each of the first metal lines and the second line width of each of the second metal lines, wherein the line width adjustment procedure comprises:
   when the length is greater than the width, reducing the first line width of each of the first metal lines and increasing the second line width of each of the second metal lines; and
   when the length is less than the width, reducing the second line width of each of the second metal lines and increasing the first line width of each of the first metal lines.

7. The planning method for power metal lines according to claim 6, wherein the first direction is perpendicular to the second direction.

8. The planning method for power metal lines according to claim 6, wherein in the line width adjustment procedure, when the length is greater than the width, the first metal line satisfies $D1'*M<D1*M$, wherein D1 is the original first line width and D1' is the reduced first line width, and the second metal line satisfies $D2'*N>D2*N$, wherein D2 is the original second line width and D2' is the increased second line width.

9. The planning method for power metal lines according to claim 6, wherein in the line width adjustment procedure, when the length is less than the width, the first metal line satisfies $D1'*M>D1*M$, wherein D1 is the original first line width and D1' is the increased first line width, and the second metal line satisfies $D2'*N<D2*N$, wherein D2 is the original second line width and D2' is the reduced second line width.

10. The planning method for power metal lines according to claim 6, wherein the first direction is a horizontal direction, and the second direction is a vertical direction; or the first direction is a vertical direction, and the second direction is a horizontal direction.

* * * * *